US012756389B2

(12) United States Patent
Cho et al.

(10) Patent No.: US 12,756,389 B2
(45) Date of Patent: Oct. 6, 2026

(54) SWITCH CONTROL DEVICE AND BATTERY PACK INCLUDING THE SAME

(71) Applicant: SAMSUNG SDI CO., LTD., Yongin-si (KR)

(72) Inventors: Kyusung Cho, Yongin-si (KR); Hyuncheol Jeon, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 260 days.

(21) Appl. No.: 18/378,986

(22) Filed: Oct. 11, 2023

(65) Prior Publication Data

US 2024/0204771 A1 Jun. 20, 2024

(30) Foreign Application Priority Data

Dec. 16, 2022 (KR) ........................ 10-2022-0177252

(51) Int. Cl.
*H03K 17/28* (2006.01)
*B60L 50/60* (2019.01)
*B60L 58/10* (2019.01)

(52) U.S. Cl.
CPC .............. *H03K 17/28* (2013.01); *B60L 50/60* (2019.02); *B60L 58/10* (2019.02)

(58) Field of Classification Search
CPC .......... B60L 58/10; B60L 50/60; H03K 17/28
See application file for complete search history.

(56) References Cited

U.S. PATENT DOCUMENTS 12,334,767 B2 * 6/2025 Qureshi ................. H01G 11/10
2008/0062602 A1 * 3/2008 Raimondi .............. H02H 3/087 361/78
2013/0231807 A1 9/2013 Yoshikawa et al.
2019/0362922 A1 * 11/2019 Bae ....................... B60L 3/0046
2020/0124672 A1 4/2020 Cho et al.
2021/0151982 A1 * 5/2021 Cho ..................... H01H 47/002
2024/0283269 A1 * 8/2024 Cho ........................ H02J 7/865

FOREIGN PATENT DOCUMENTS

| | | | |
|---|---|---|---|
| EP | 3 575 139 | A1 | 12/2019 |
| KR | 10-1855092 | B1 | 5/2018 |
| KR | 10-2019-0135261 | A | 12/2019 |
| KR | 10-2121639 | B1 | 6/2020 |

OTHER PUBLICATIONS

Extended European Search Report dated Mar. 22, 2024, for corresponding European Patent Application No. 23202848.0.

* cited by examiner

*Primary Examiner* — Thomas J. Hiltunen
*Assistant Examiner* — Khareem E Almo
(74) *Attorney, Agent, or Firm* — Lee IP Law, P.C.

(57) ABSTRACT

A switch control device includes a retention circuit receiving a control signal and a safety signal, the retention circuit operating in a transfer mode for outputting a switch control signal having a variable level that is changed according to the control signal based on the safety signal or a retention mode for retaining the switch control signal in a previous state for a predetermined time, a retention control circuit configured to limit an operation of the retention circuit in the retention mode if a disable signal is received, a first controller configured to output the control signal to control a switch and to output the disable signal according to an operation state of a device in which the switch control device is mounted, and a second controller configured to output the safety signal according to the operation state of the first controller.

16 Claims, 4 Drawing Sheets

SWITCH CONTROL DEVICE AND BATTERY PACK INCLUDING THE SAME

CROSS-REFERENCE TO RELATED APPLICATION

Korean Patent Application No. 10-2022-0177252, filed in the Korean Intellectual Property Office on Dec. 16, 2022, is incorporated herein by reference in its entirety.

BACKGROUND

1. Field

A switch control device and a battery pack including the same is disclosed.

2. Description of the Related Art

Recently, according to strengthening of environmental regulations including $CO_2$ regulations, interest in environmentally-friendly vehicles has been increasing. Accordingly, vehicle companies have been actively researching and developing pure electrical vehicles and hydrogen vehicles, as well as hybrid and plug-in hybrid vehicles.

SUMMARY

Embodiments are directed to a switch control device, including a retention circuit that may receive a control signal and a safety signal, and may operate in a transfer mode for outputting a switch control signal having a variable level that may be changed according to the control signal based on the safety signal or may operate in a retention mode for retaining a switch control signal in a previous state for a predetermined time, a retention control circuit that may be configured to limit an operation of the retention circuit in the retention mode if a disable signal is received, a first controller that may be configured to output the control signal to control a switch and to output the disable signal according to an operation state of a device in which the switch control device may be mounted, and a second controller that may be configured to output the safety signal according to the operation state of the first controller, wherein the retention circuit may operate in the transfer mode regardless of the safety signal while the operation of the retention circuit in the retention mode may be limited by the retention control circuit.

In embodiments of the switch control device, the retention control circuit may allow the retention circuit to operate in the retention mode if a reset signal is received, and the first controller may output the reset signal according to the operation state of the device.

In embodiments of the switch control device, the retention circuit may include a latch circuit operating in one of the transfer mode and the retention mode and may output the switch control signal according to a logical product result of the control signal and the safety signal while operating in the transfer mode and may retain the switch control signal in a previous state while operating in the retention mode, and may also include a timer circuit that may operate the latch circuit in the transfer mode if a predetermined time elapses after the latch circuit operates in the retention mode.

In embodiments of the switch control device, the retention circuit may include an input circuit that may control switching of the latch circuit to the retention mode and that may start a timer of the timer circuit according to the safety signal.

In embodiments of the switch control device, the input circuit may include a first transistor that may be turned on or off according to the control signal and that may electrically connect a first node and a second node if turned on, and also include a second transistor that may be turned on or off according to the safety signal and that may electrically connect the second node and a ground if turned on, wherein the latch circuit may control switching to the retention mode according to a voltage of the second node, and may output the switch control signal according to a voltage of the first node in the transfer mode.

In embodiments of the switch control device, the first and second transistors may be NPN transistors.

In embodiments of the switch control device, the latch circuit may include a third transistor that may be turned on or off according to the voltage of the first node and that may electrically connect an output node, from which the switch control signal is output, and a power node if turned on, a fourth transistor that may be turned on or off according to a voltage of a third node and that may electrically connect the first node and the ground if turned on, a first capacitor that may be electrically connected between the power node and the first node, a first resistor that may be electrically connected between the power node and the first node, a second resistor that may be electrically connected between the third node and the output node, and a second capacitor that may be electrically connected between the output node and the ground, wherein the voltage of the third node may be determined by the voltage of the second node, a voltage of the output node, and a voltage applied from the timer circuit.

In embodiments of the switch control device, the third transistor may be a PNP transistor, and the fourth transistor may be an NPN transistor.

In embodiments of the switch control device, the latch circuit may include a Zener diode that may include a cathode that may be electrically connected to the second node and an anode that may be electrically connected to the third node, and a fifth transistor that may be turned on or off according to the voltage of the third node, and that may electrically connect a control terminal of the second transistor and the ground if turned on, wherein the fifth transistor may be an NPN transistor.

In embodiments of the switch control device, the timer circuit may include a sixth transistor that may be turned on or off according to a voltage that may be applied to a control terminal of the second transistor and that may electrically connect a fourth node and the ground if turned on, a third resistor that may be electrically connected between the power node and the fourth node, a third capacitor that may be electrically connected between the fourth node and the ground, and a seventh transistor that may be turned on or off according to a voltage of the fourth node and that may electrically connect the third node and the ground if turned on.

In embodiments of the switch control device, the sixth transistor may be an NPN transistor, and the seventh transistor may be a metal oxide semiconductor field effect transistor.

In embodiments of the switch control device, the retention control circuit may include an off circuit that may output a timer off signal to the timer circuit to retain a timer operation of the timer circuit in an off state if the disable signal is input.

In embodiments of the switch control device, the off circuit may include an eighth transistor that may be turned on or off according to a voltage of a fifth node and that may electrically connect the power node and a sixth node if turned on, a ninth transistor that may be turned on or off according to a voltage of the sixth node and that may electrically connect the fifth node and the ground if turned on, a fourth capacitor that may be electrically connected between the sixth node and the ground, a fourth resistor that may be electrically connected between the power node and a control terminal of the eighth transistor, a fifth resistor that may be electrically connected between the sixth node and a control terminal of the ninth transistor, and a diode including a first anode to which the disable signal may be input, and a first cathode that may be connected to the sixth node, wherein the timer off signal may be output to the sixth node if the eighth transistor and the ninth transistor are turned on.

In embodiments of the switch control device, the eighth transistor may be a PNP transistor, and the ninth transistor may be an NPN transistor.

In embodiments of the switch control device, the timer circuit may include a second diode that may include a second anode that may be electrically connected to the fourth node and a second cathode that may be electrically connected to a control terminal of the seventh transistor, and a third diode that may include an anode that may be electrically connected to the sixth node, and a cathode that may be electrically connected to the control terminal of the seventh transistor.

In embodiments of the switch control device, the retention control circuit may include a release circuit that may release an output of the timer off signal of the off circuit if the reset signal is input.

In embodiments of the switch control device, the release circuit may include a tenth transistor that may be turned on or off according to the reset signal and that may electrically connect the second node and the ground if turned on, and wherein the tenth transistor may be an NPN transistor.

Embodiments are also directed to a battery pack that may have a battery module including a plurality of cells that may be connected in series or parallel to each other, a switch that may be controlling an electrical connection between the battery module and a load, a driver that may be controlling opening and closing of the switch, and a switch control device, wherein the driver may control opening and closing of the switch according to a switch control signal that may be output from the switch control device.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
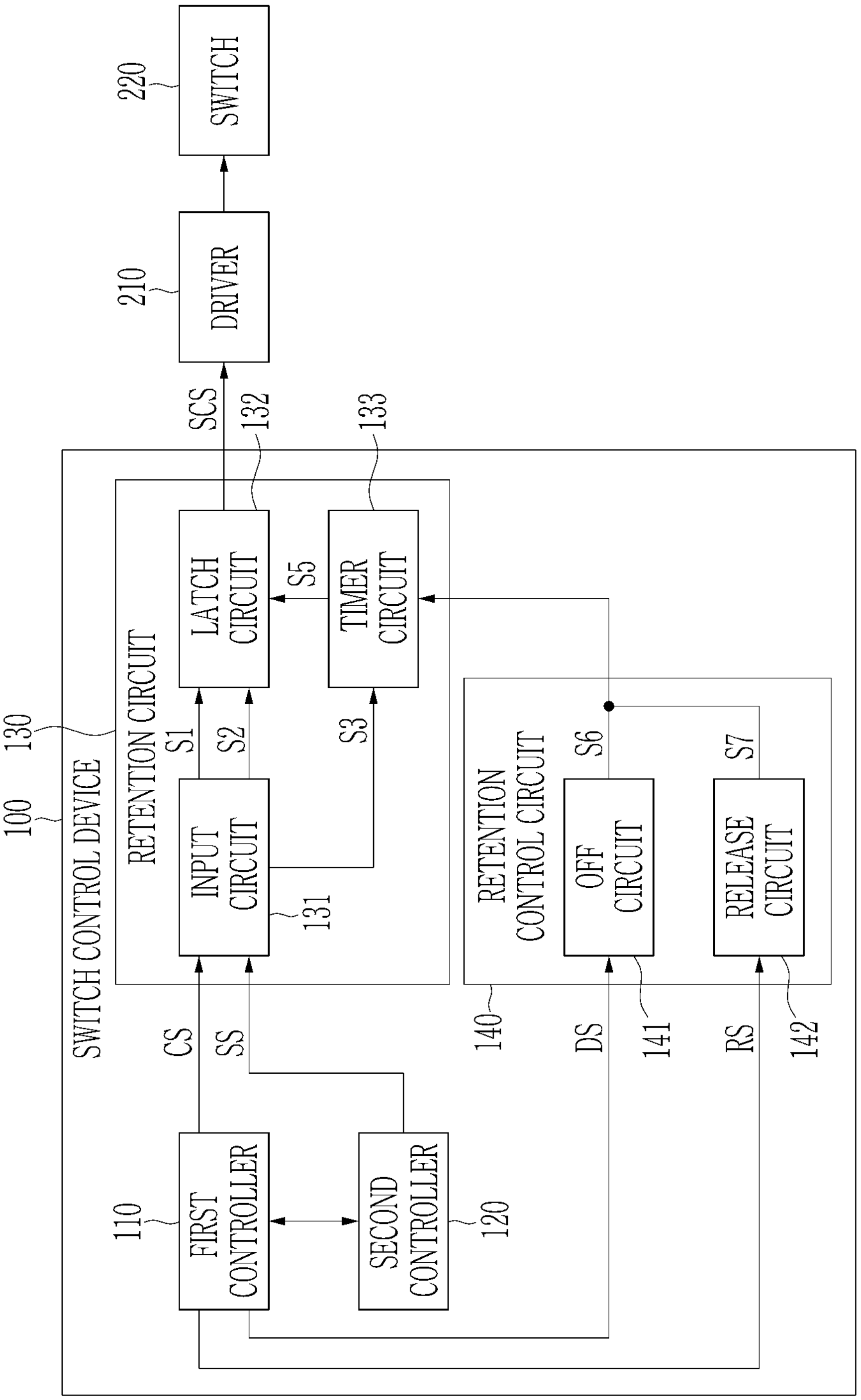
FIG. 1 is a block diagram showing a switch control device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that if a layer or element is referred to as being "on" another layer or substrate, it can be directly on the other layer or substrate, or intervening layers may also be present. Further, it will be understood that if a layer is referred to as being "under" another layer, it can be directly under, and one or more intervening layers may also be present. In addition, it will also be understood that if a layer is referred to as being "between" two layers, it can be the only layer between the two layers, or one or more intervening layers may also be present. Like reference numerals refer to like elements throughout.

The term "and/or" in this document includes any or all combinations of multiple items listed in connection therewith. The use of "can/may" in describing an embodiment of the present disclosure indicates "at least one embodiment of the present disclosure."

Terms in the singular form in this document may include the plural form unless the context clearly dictates otherwise.

In this document, terms including ordinal numbers such as "first", "second", and "third" are used to describe various components, but these components are not limited by these terms. The terms are only used to differentiate one component from other components. For example, without departing from the scope rights described in this document, a first component may be referred to as a second component, and similarly, the second component may also be renamed as the first component.

In this document, if one component or layer is described as "on", "connected to", or "coupled" to another component or layer, "on", "connected to" and "coupled to" "Includes those formed directly or through the intervening of one or more other components or layers. In addition, if one component or layer is described as being "between" two components or layers, it should be understood that it is the only component or layer between two components or layers, or that there are one or more intervening other components or layers.

In this document, a case of electrically connecting two constituent elements includes not only a case of directly connecting the constituent elements but also a case of connecting the constituent elements via another constituent element therebetween. The constituent element therebetween may include a switch, a resistor, a capacitor, and the like. In describing exemplary embodiments, an expression of connection indicates electrical connection unless explicitly described to be direct connection.

Hereinafter, a switch control device and a battery pack including the same according to an embodiment will be described with reference to necessary drawings.

FIG. 1 is a block diagram showing a switch control device according to an example embodiment. Referring to FIG. 1, the switch control device 100 may include a first controller 110, a second controller 120, a retention circuit 130, and a retention control circuit 140.

The first controller 110 may determine whether to open or close a switch 220 and output a control signal CS for controlling the switch 220. In an implementation, the first controller 110 may output the control signal CS of a high level to turn on (close) the switch 220 and may output the control signal CS of a low level to turn off (open) the switch 220. In this document, the high level and the low level may indicate a voltage level that is higher than a predetermined voltage and a voltage level that is lower than the predetermined voltage, respectively, based on a predetermined voltage. In an implementation, the high level may represent an operation voltage of the first controller 110 or a voltage close to the operation voltage, and the low level may represent a ground voltage or a voltage close to ground voltage.

The first controller 110 may monitor an operation state of a system (e.g., a vehicle) in which the switch control device 100 is mounted, and may output a disable signal DS or a reset signal RS to limit (prohibit) or allow a latch mode operation of the retention circuit 130 described later according to the operation state of the system. The first controller 110 may limit a retention mode operation of the retention circuit 130 by outputting the disable signal DS in a state where the state of the system is not stabilized (abnormal mode), such as if the power is initially turned on. Thereafter, if the system state is stabilized (normal mode), the first controller 110 may output the reset signal RS to allow the retention circuit 130 to operate in the retention mode.

The second controller 120 may monitor an operation state of the first controller 110. In an implementation, the second controller 120 may continuously communicate with the first controller 110 and may determine the operation state of the first controller 110 from a communication state with the first controller 110. In addition, e.g., the second controller 120 may periodically receive an error detection signal from the first controller 110 to detect the operation state of the first controller 110 and may determine the operation state of the first controller 110 according to a reception state of the error detection signal (a reception status, a pulse width, or a reception period). The second controller 120 may output a safety signal SS indicating the operation state of the first controller 110, that is, whether the operation is normal. In an implementation, the second controller 120 may output a high-level safety signal during a normal operation of the first controller 110 and may output a low-level safety signal during an abnormal operation of the first controller 110. As used herein, the term "or" is not an exclusive term, e.g., "A or B" would include A, B, or A and B.

The retention circuit 130 may receive the control signal CS and the safety signal SS from the first controller 110 and the second controller 120. The retention circuit 130 may generate a switch control signal SCS according to the control signal CS and the safety signal SS and may output the switch control signal SCS to the driver 210. The retention circuit 130 may transfer the switch control signal SCS corresponding to the control signal CS input from the first controller 110 to the driver 210 according to the operation state of the first controller 110 indicated by the safety signal SS, or may retain the switch control signal SCS in a previous state regardless of the control signal CS to output it for a predetermined period of time (e.g., 3 s).

If the safety signal SS indicates the normal state of the first controller 110, the retention circuit 130 may operate in a transfer mode for transferring the switch control signal SCS corresponding to the control signal CS input from the first controller 110 to the driver 210. While operating in the transfer mode, the retention circuit 130 may output the switch control signal SCS indicating an off (open) state of the switch 220 to the driver 210 if the control signal CS indicates the off (open) state of the switch 220, and may output the switch control signal SCS indicating an on (closed) state of the switch 220 to the driver 210 if the control signal CS indicates the on (closed) state of the switch 220.

If the safety signal SS indicates the abnormal state of the first controller 110, the retention circuit 130 may operate in a retention mode to retain a level of the switch control signal SCS at a previous state for a predetermined time regardless of the control signal CS inputted from the first controller 110. If entering the retention mode, the retention circuit 130 may retain the retention mode for a predetermined time regardless of the safety signal SS that is subsequently inputted. While operating in the retention mode, the retention circuit 130 may retain the switch control signal SCS in a state of entering the retention mode. If a predetermined time elapses after entering the retention mode, the retention circuit 130 may end the retention mode, and may return to the transfer mode.

The retention circuit 130 may include an input circuit 131, a latch circuit 132, and a timer circuit 133.

The input circuit 131 may receive the control signal CS and the safety signal SS from the first controller 110 and the second controller 120, respectively, and may output signals S1, S2, and S3 for controlling operations of the latch circuit 132 and the timer circuit 133 based on these signals.

The input circuit 131 may control the operation mode of the latch circuit 132 by activating or deactivating a retention function of the latch circuit 132 according to the safety signal SS. The safety signal SS being input while the retention function of the latch circuit 132 is deactivated (if the latch circuit 132 operates in the transfer mode) may indicate the normal state of the first controller 110, and the input circuit 131 may control the latch circuit 132 to operate in the transfer mode by retaining the inactive state of the latch circuit 132. In an implementation, the input circuit 131 may deactivate the retention function of the latch circuit 132 by outputting a latch control signal S2 to the latch circuit 132. The safety signal SS being input if the retention function of the latch circuit 132 is deactivated may indicate the abnormal state of the first controller 110, and the input circuit 131 may activate the retention function of the latch circuit 132 to operate the latch circuit 132 in a retention mode. In an implementation, the input circuit 131 may stop outputting the latch control signal S2 to activate the retention function of the latch circuit 132.

While the latch circuit 132 operates in the transfer mode, the input circuit 131 may control the level of the switch control signal SCS output from the latch circuit 132 by outputting a transfer signal S1 according to the control signal CS to the latch circuit 132.

If the latch circuit 132 operates in the retention mode, the input circuit 131 may output a timer start signal S3 for activating a timer function of the timer circuit 133 to the timer circuit 133. The latch circuit 132 may deactivate (off) or activate (on) the retention function according to the latch control signal S2 received from the input circuit 131. In an implementation, the latch circuit 132 may deactivate the retention function while the latch control signal S2 is received from the input circuit 131 and may activate the retention function if the latch control signal S2 is not received from the input circuit 131.

If the retention function is deactivated, the latch circuit 132 may operate in the transfer mode to control an output level of the switch control signal SCS according to the transfer signal S1 received from the input circuit 131. The latch circuit 132 may operate in the retention mode if the retention function is activated and may retain the switch control signal SCS in a previous state for a predetermined time to output it.

The latch circuit 132 may operate in the retention mode, may automatically release the retention mode if a predetermined time elapses, and may operate in the transfer mode. A retention mode operation time of the latch circuit 132 may be controlled by the timer circuit 133. The latch circuit 132 may operate in the retention mode while a timer function of the timer circuit 133 is activated (on), and if the timer function is ended (off), the retention mode may be ended and switched to the transfer mode.

The timer circuit 133 may activate (on) the timer function according to the timer start signal S3 received from the input circuit 131. If the timer function is activated, the timer circuit 133 may check a time elapsed from if the timer function is activated. The timer circuit 133 may output a timer end signal S5 to the latch circuit 132 if a predetermined time elapses from if the timer function is activated and may deactivate (off) the timer function.

If the timer end signal S5 is received from the timer circuit 133, the latch circuit 132 may deactivate the retention function, and may operate in the transfer mode.

The retention control circuit 140 may receive the disable signal DS or the reset signal RS from the first controller 110. The retention control circuit 140 may limit or allow the retention mode operation of the retention circuit 130 according to the disable signal DS or the reset signal RS received from the first controller 110.

The retention control circuit 140 may include an off circuit 141 and a release circuit 142.

The off circuit 141 may receive the disable signal DS from the first controller 110. The off circuit 141 may limit the retention mode operation of the retention circuit 130 if the disable signal DS is received. If the disable signal DS is received, the off circuit 141 may retain the timer function of the timer circuit 133 in an inactive (off) state by outputting a timer off signal S6. While the timer function of the timer circuit 133 retains an off state, an operation of the latch circuit 132 in the retention mode may be restricted regardless of the safety signal SS.

The release circuit 142 may receive the reset signal RS from the first controller 110. If the reset signal RS is received, the release circuit 142 may allow the retention circuit 130 to operate in the retention mode. If the reset signal RS is received, the release circuit 142 may output a release signal S7 for releasing the timer off signal S6 of the timer circuit 133. If the release signal S7 is inputted from the release circuit 142, the off circuit 141 may stop outputting the timer off signal S6, and accordingly, operation restriction of the timer circuit 133 may be released.

The timer circuit 133 may retain the timer function in an off (inactivated) state regardless of the timer start signal S3 while the timer off signal S6 is received. Then, if the release signal S7 is received, the timer circuit 133 may control the timer function to be activated or deactivated (on or off) according to the timer start signal S3.

The driver 210 may control the switch 220 (e.g., a contactor or a relay) to be on (closed) or off (open) according to the switch control signal SCS received from the switch control device 100. In an implementation, the driver 210 may control the switch 220 to be in an on (closed) state if the switch control signal SCS is at a high level and may control the switch 220 to an off (open) state if the switch control signal SCS is at a low level.

Figure 2:
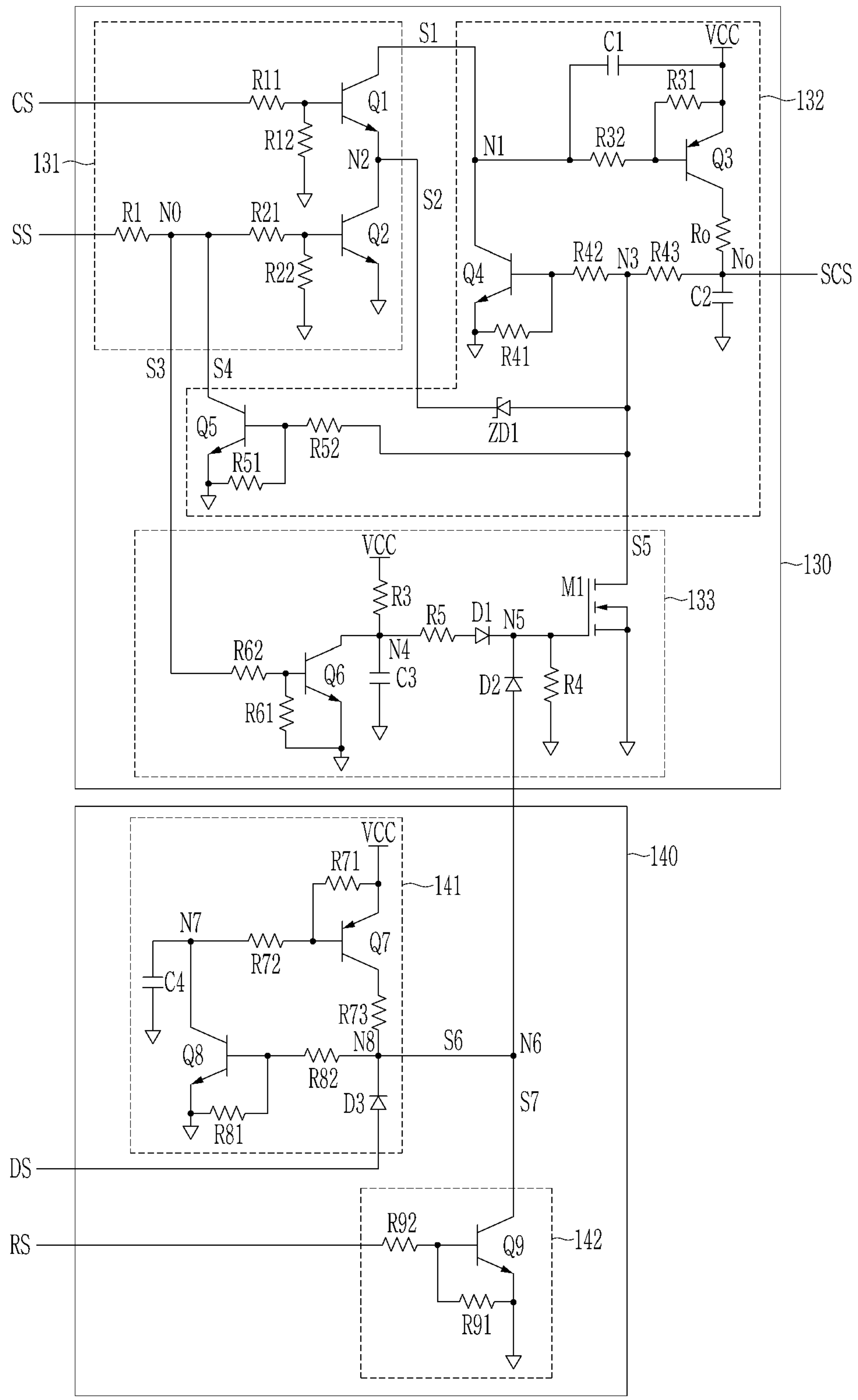
FIG. 2 is a circuit diagram showing a circuit configuration including a retention switch connected to a retention control circuit according to an example embodiment.

FIG. 2 shows a circuit configuration including a retention switch connected to a retention control circuit according to an example embodiment. Referring to FIG. 2, the input circuit 131 of the retention circuit 130 may include two transistors Q1 and Q2 connected in series between a node N1 and a ground. The transistor Q1 may include a control terminal to which the control signal CS is inputted, a first terminal electrically connected to the node N1, and a second terminal electrically connected to a node N2. The transistor Q2 may include a control terminal to which the safety signal SS is inputted, a first terminal electrically connected to the node N2, and a second terminal electrically connected to the ground. The input circuit 131 may further include resistors R11 and R12 electrically connected to the control terminal of the transistor Q1 for a stable operation of the transistor Q1, and resistors R21 and R22 electrically connected to the control terminal of the transistor Q2 for a stable operation of the transistor Q2. The input circuit 131 may further include a resistor R1 electrically connected between a terminal from which the safety signal SS may be output from the second controller 120 and a node N0.

The transistor Q1 may be turned on or turned off according to the control signal CS. The transistor Q1 may be turned on if the control signal CS is at a level for turning on the switch 220 (e.g., a high level), and may be turned off if the control signal CS is at a level for turning off the switch 220 (e.g., a low level). The transistor Q2 may be turned on or off according to the safety signal SS. The transistor Q2 may be turned on if the safety signal SS is at a level indicating the normal state of the first controller 110 (e.g., a high level), and may be turned off if the safety signal SS is at a level (e.g., low level) indicating the abnormal state of the first controller 110. If the transistor Q2 is turned on, the node N2 and the ground may be electrically connected through the transistor Q2. If the transistor Q1 is turned on, the node N1 and the node N2 may be electrically connected through the transistor Q1. Accordingly, if the transistors Q1 and Q2 are turned on, a low-level transfer signal S1 may be outputted to the node N1. On the other hand, if any one of the transistors Q1 and Q2 is turned off, connection between the node N1 and the ground may be cut off.

The transistors Q1 and Q2 may be NPN transistors in which a control terminal is a base terminal, and a first terminal and a second terminal are a collector terminal and an emitter terminal, respectively. The transistor Q1 may be turned on if the high-level control signal CS is inputted, and turned off if the low-level control signal CS is inputted. In addition, the transistor Q2 may be turned on if the high-level safety signal SS is inputted, and turned off if the low-level safety signal SS is inputted.

The latch circuit 132 of the retention circuit 130 may include two transistors Q3 and Q4 for performing a retention function. The transistor Q3 may include a control terminal electrically connected to the node N1, a first terminal electrically connected to a power node VCC, and a second terminal electrically connected to an output node No. The transistor Q4 may include a control terminal electrically connected to the output node No, a first terminal electrically connected to the node N1, and a second terminal electrically connected to the ground. The power node VCC may be a node to which a power voltage is applied from a power source. In an implementation, the power node VCC may be a node connected to a power supply supplying an operation voltage to the first controller 110 and the second controller 120, and a same voltage as operation voltages of the first controller 110 and the second controller 120 may be applied to the power node VCC.

The latch circuit 132 may include a resistor R31 electrically connected between the control terminal and the first terminal of the transistor Q3, a resistor R32 electrically connected between the node N1 and the control terminal of the transistor Q3, and a capacitor C1 electrically connected between the power node VCC and the node N1. The latch circuit 132 may further include a resistor Ro electrically connected between the second terminal of the transistor Q3 and the output node No, and a capacitor C2 electrically connected between output node No and the ground. The latch circuit 132 may include a resistor R41 electrically connected between the control terminal and the second terminal of the transistor Q4, a resistor R42 electrically connected between the control terminal of the transistor Q4 and the node N3, and a resistor R43 electrically connected between the node N3 and the output node No.

The transistor Q3 may be turned on or off by a voltage applied to the node N1. If the transistor Q3 is turned on, a voltage applied to the power node VCC may be transferred to the output node No to allow the high level switch control signal SCS to be outputted to the output node No. If the transistor Q3 is turned off, connection between the power node VCC and the output node No may be cut off to allow the low level switch control signal SCS to be output to the output node No.

Turn-on or turn-off of the transistor Q4 may be controlled by a voltage applied to the node N3. If turned on, the transistor Q4 may electrically connect the node N1 to the ground.

The transistor Q3 may be a PNP transistor having a control terminal as a base terminal and first and second terminals as an emitter terminal and a collector terminal, respectively. Accordingly, the transistor Q3 may be turned on if a voltage that is lower than a predetermined voltage is applied to the node N1, and turned off if a voltage that is equal to or higher than the predetermined voltage is applied to the node N1. If both the transistor Q1 and the transistor Q2 are turned on, the low-level transfer signal S1 may be applied to the node N1. In addition, even if the transistor Q4 is turned on, the node N1 may be electrically connected to the ground to allow a low level voltage to be applied to the node N1. On the other hand, if all the transistors Q1, Q2, and Q4 are turned off, a voltage that is higher than a predetermined voltage may be applied to the node N1 through the capacitor C1 and the resistors R31 and R32. Accordingly, the transistor Q3 may be turned on if both the control signal CS and the safety signal SS are at a high level so that both the transistors Q1 and Q2 are turned on, or the transistor Q4 is turned on.

The transistor Q4 may be an NPN transistor in which a control terminal is a base terminal, and a first terminal and a second terminal are a collector terminal and an emitter terminal, respectively. Accordingly, the transistor Q4 may be turned on if a voltage that is greater than a predetermined voltage is applied to the node N3, and turned off if a voltage that is equal to or lower than the predetermined voltage is applied to the node N3. If the transistor Q4 is turned on, the transistor Q3 may be turned on regardless of the transfer signal S1 to retain the switch control signal SCS at a high level. On the other hand, if the transistor Q4 is turned off, the transistor Q3 may control a level of the switch control signal SCS according to the transfer signal S1.

The latch circuit 132 may further include a Zener diode ZD1 and a transistor Q5. The Zener diode ZD1 may have an anode electrically connected to the node N3 and a cathode electrically connected to the node N2. The transistor Q5 may include a control terminal electrically connected to the node N3, a first terminal electrically connected to the node N0, and a second terminal electrically connected to the ground. The latch circuit 132 may further include resistors R51 and R52 electrically connected to a control terminal of the transistor Q5 for a stable operation of the transistor Q5.

While the high-level safety signal SS is input to retain a turned-on state of the transistor Q2, the low-level latch control signal S2 may be output to the node N2. While the low-level latch control signal S2 is being output, a voltage that is lower than or equal to a predetermined voltage may be applied to the node N3, and accordingly, the transistor Q4 may retain a turned-off state.

If the low-level safety signal SS is inputted and the transistor Q2 is turned off, output of the low-level latch control signal S2 may be stopped. Accordingly, a voltage of the node N3 may be determined according to the level of the switch control signal SCS being outputted through the output node N0 if the transistor Q2 is turned off. If the switch control signal SCS has a high level, a voltage that is equal to or higher than a predetermined voltage may be applied to the node N3, and accordingly, the transistor Q4 may be turned on to allow the retention function to be activated.

The transistor Q5 may be turned on or off according to a voltage applied to the node N3. If the transistor Q5 is turned on, a low-level retention signal S4 may be outputted to the node N0. While the low-level retention signal S4 is outputted to the node N0, the transistor Q2 may retain a turned-off state regardless of the level of the safety signal SS.

The transistor Q5 may be an NPN transistor in which a control terminal is a base terminal, and a first terminal and a second terminal are a collector terminal and an emitter terminal, respectively. Accordingly, the transistor Q5 may be turned on if a voltage that is greater than a predetermined voltage is applied to the node N3, and turned off if a voltage that is equal to or lower than the predetermined voltage is applied to the node N3. In an implementation, the transistor Q5 may be turned on if the transistor Q4 is turned on (if the retention function of the latch circuit 132 is activated), to allow the transistor Q2 to be controlled to be turned off. Thereafter, the transistor Q2 may retain a turned-off state until the transistor Q4 is turned off again.

The timer circuit 133 of the retention circuit 130 may include a transistor M1, a transistor Q6, a resistor R3, and a capacitor C3. The transistor M1 may include a control terminal electrically connected to the node N5, a first terminal electrically connected to the node N3, and a second terminal electrically connected to the ground. The transistor Q6 may include a control terminal electrically connected to the node N0, a first terminal electrically connected to the node N4, and a second terminal electrically connected to the ground. The resistor R3 may be electrically connected between the power node VCC and the node N4. The capacitor C3 may be electrically connected between the node N4 and the ground.

The timer circuit 133 may further include resistors R61 and R62 electrically connected to a control terminal of the transistor Q6 for a stable operation of the transistor Q6. The timer circuit 133 may further include a resistor R4 electrically connected between a control terminal of the transistor M1 and the ground. The timer circuit 133 may further include a resistor R5 electrically connected to node N4, a diode D1 electrically connected between the resistor R5 and the control terminal of the transistor M1, and a diode D2 electrically connected between a node N5 and a node N6 of the retention control circuit 140. The diodes D1 and D2 may perform a function of limiting a current direction. The diode D1 may have an anode electrically connected to the node N4 through the resistor R5 and a cathode electrically connected to the node N5. The diode D2 has an anode electrically connected to the node N6 of the retention control circuit 140 and a cathode electrically connected to the node N5.

The transistor Q6 may be turned on or off according to the timer start signal S3 input from the node N0. If the transistor Q6 is turned on, the node N4 may be connected to the ground by the transistor Q6. If the transistor Q6 is turned off, the capacitor C3 may be charged by a voltage applied to the power node VCC to allow the voltages of the nodes N4 and N5 to gradually increase.

The transistor Q6 may be an NPN transistor in which a control terminal is a base terminal, and a first terminal and a second terminal are a collector terminal and an emitter terminal, respectively. Accordingly, the transistor Q6 may be turned on if a high-level timer start signal S3 is inputted from the node N0 and may be turned off if the low-level timer start signal S3 is inputted from the node N0. The timer start signal S3 may become a low level if the safety signal SS is at a low level or if the transistor Q5 is turned on. The timer start signal S3 may become a high level if the safety signal SS is at a high level and the transistor Q5 is turned off. In an implementation, the transistor Q6 may be turned off if the safety signal SS is at a low level or the transistor Q5 is turned on, and turned on if the safety signal SS is at a high level and the transistor Q5 is turned off.

The transistor M1 may be turned on or off according to a voltage applied to the node N5. If turned on, the transistor M1 may output a low-level timer end signal S5 to the node N3.

The transistor M1 may be a N-channel metal oxide semiconductor field effect transistor (N-channel MOSFET) in which a control terminal is a gate terminal, and a first terminal and a second terminal are a drain terminal and a source terminal, respectively. Accordingly, the transistor M1 may be turned on if a voltage that is greater than a predetermined voltage is applied to the node N5, and turned off if a voltage that is equal to or lower than the predetermined voltage is applied to the node N5. If the transistor Q6 is turned off to allow a voltage applied to the node N5 to be higher than a predetermined voltage, the transistor M1 may be turned on to output the low-level timer end signal S5 to the node N3. In this case, after the transistor Q6 is turned off, a predetermined delay time (e.g., 3 s) may occur until a voltage sufficient to turn on the transistor M1 is applied to the node N5. Due to such a delay time, after the transistor Q6 is turned off by the timer start signal S3, a predetermined delay may occur until the timer end signal S5 is applied to the node N3 to deactivate the retention function of the latch circuit 132.

The off circuit 141 of the retention control circuit 140 may include two transistors Q7 and Q8 for performing a retention function. The transistor Q7 may include a control terminal electrically connected to the node N7, a first terminal electrically connected to a power node VCC, and a second terminal electrically connected to a node N8. The transistor Q8 may include a control terminal electrically connected to the node N8, a first terminal electrically connected to the node N7, and a second terminal electrically connected to the ground.

The off circuit 141 may further include a resistor R71 electrically connected between a control terminal and a first terminal of the transistor Q7, a resistor R72 electrically connected between the node N7 and the control terminal of the transistor Q7, a resistor R73 electrically connected between the second terminal of the transistor Q7 and the node N8, and a capacitor C4 electrically connected between the node N7 and the ground. The off circuit 141 may further include a resistor R81 electrically connected between a control terminal and a second terminal of the transistor Q8, a resistor R82 electrically connected between the control terminal of the transistor Q8 and the node N8, and a diode D3 electrically connected to the node N8. The diode D3 may receive the disable signal DS through an anode terminal, and a cathode terminal therof may be electrically connected to the node N8. The diode D3 may perform a function of limiting a current direction.

The transistor Q7 may be turned on or off by a voltage applied to the node N7. If the transistor Q7 is turned on, the power node VCC and the node N8 may be connected to each other to allow the high level timer off signal S6 to be outputted to the node N8 and the node N6.

The transistor Q8 may be turned on or off by a voltage applied to the node N8. If turned on, the transistor Q8 may connect the ground and the node N7.

The transistor Q7 may be a PNP transistor having a control terminal as a base terminal and first and second terminals as an emitter terminal and a collector terminal, respectively. Accordingly, the transistor Q7 may be turned on if a voltage that is lower than a predetermined voltage is applied to the node N7, and turned off if a voltage that is equal to or higher than the predetermined voltage is applied to the node N7. If the transistor Q8 is turned on, the node N7 may be connected to the ground through the transistor Q8. Accordingly, if the transistor Q8 is turned on, the transistor Q7 may also be turned on. On the other hand, if the transistor Q8 is turned off, a voltage that is equal to or higher than a predetermined voltage may be applied to the node N7 by the capacitor C4 and the resistors R71 and R72, and the transistor Q7 may be turned off.

The transistor Q8 may be an NPN transistor in which a control terminal is a base terminal, and a first terminal and a second terminal are a collector terminal and an emitter terminal, respectively. Accordingly, the transistor Q8 may be turned on if a voltage that is higher than a predetermined voltage is applied to the node N8. If the high-level disable signal DS is inputted or the transistor Q7 is turned on, a signal having a higher voltage than a predetermined voltage (high-level timer off signal S6) may be applied to the node N8. Accordingly, the transistor Q8 may be turned on if the high-level disable signal DS is inputted, and thereafter, the high-level timer off signal S6 may be applied to the node N8 by the turned-on transistor Q7 to allow the turned-on state to be retained. As such, even if the disable signal DS is inputted as a single pulse signal, the off circuit 141 may retain the high-level timer off signal S6 to allow it to be continuously outputted to the node N6.

The timer off signal S6 output by the off circuit 141 may be transferred to the node N5 of the timer circuit 133. While the high-level timer off signal S6 from the off circuit 141 is output to the node N5, the transistor M1 remains turned on and a retention mode operation of the latch circuit 132 may be limited.

The release circuit 142 of the retention control circuit 140 may include a transistor Q9. The transistor Q9 may include a control terminal to which the reset signal RS is inputted, a first terminal electrically connected to the node N6, and a second terminal electrically connected to the ground. The release circuit 142 may further include resistors R91 and R92 electrically connected to a control terminal of the transistor Q9 for a stable operation of the transistor Q9.

The transistor Q9 may be turned on or off by the reset signal RS. If turned on, the transistor Q9 may output a low-level release signal S7 to the node N6.

The transistor Q9 may be an NPN transistor in which a control terminal is a base terminal, and a first terminal and a second terminal are a collector terminal and an emitter terminal, respectively. Accordingly, if the reset signal RS is applied, the transistor Q9 may be turned on to allow the low-level release signal S7 to be outputted to the node N6. If the transistor Q9 is turned on and the low-level release signal S7 is applied to the node N6, the transistor Q8 of the off circuit 141 may be turned off to allow the latch operation of the off circuit 141 to be released. Accordingly, the output of the high level timer off signal S6 may be stopped to allow the latch circuit 132 to operate in the retention mode.

Hereinafter, an operation of the switch control device 100 according to an embodiment will be described in more detail with reference to FIG. 2 and FIG. 3.

Figure 3:
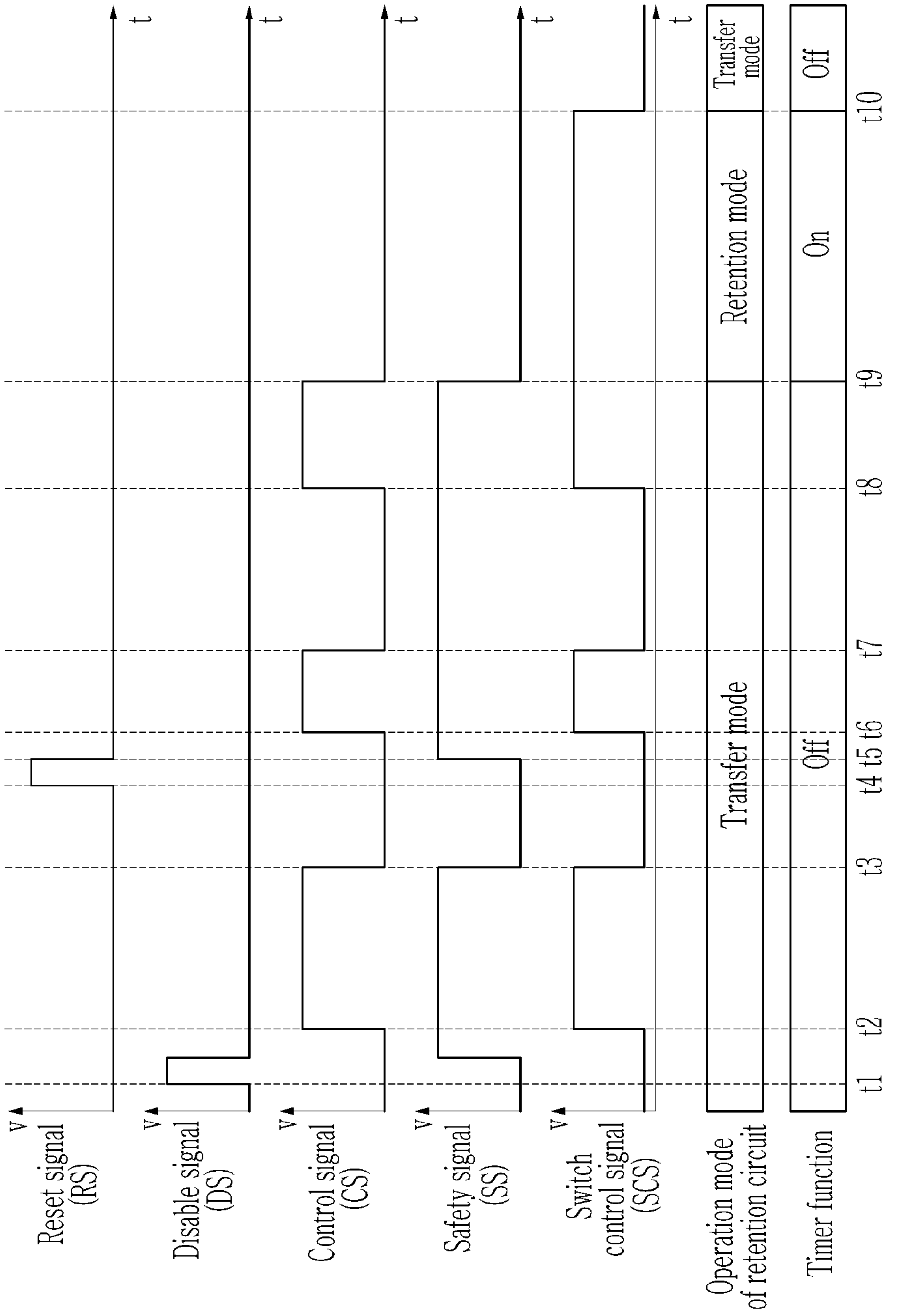
FIG. 3 is a timing diagram showing pulse signals of a switch control device according to an example embodiment.

FIG. 3 shows a timing diagram of a switch control device according to an example embodiment. Referring to FIG. 3, if the operation of the latch circuit 132 in the retention mode is limited, the first controller 110 may output the disable signal DS formed of one pulse signal once (see time t1). Accordingly, all the transistors Q7 and Q8 of the off-circuit 141 are turned on to allow the off-circuit 141 to operate as a latch circuit that continuously outputs the high-level timer off signal S6. In addition, the transistor M1 of the timer circuit 133 may be retained in a turned-on state by the high-level timer off signal S6 being continuously output from the off circuit 141. While the transistor M1 remains turned on, the transistor Q4 of latch circuit 132 may remain turned off, thereby limiting the retention mode operation of the latch circuit 132.

As a retention mode operation of the latch circuit 132 is restricted, the latch circuit 132 may operate only in the transfer mode regardless of the safety signal SS. While operating in transfer mode, the transistor Q3 may be controlled to turn on or turn off according to the control signal CS. Accordingly, the switch control signal SCS having a level that may be controlled according to the control signal CS may be outputted to the driver 210. In an implementation, if the high level control signal CS is outputted from the first controller 110, the transistor Q3 may be turned on to output the high-level switch control signal SCS to the driver 210 (see time t2), and if the low-level control signal CS is outputted from the first controller 110, the transistor Q3 may be turned off to allow the low-level switch control signal SCS to be outputted to the driver 210 (see time t3).

Then, the first controller 110 may output the reset signal RS composed of one pulse signal to allow the latch circuit 132 to operate in the retention mode (see time t4). Accordingly, the transistor Q9 of the release circuit 142 may be turned on, and a low-level release signal S7 may be output to the off circuit 141. In addition, all the transistors Q7 and Q8 of the off circuit 141 may be turned off by the release signal S7 to allow the timer off state generated by the off circuit 141 to be released. In an implementation, the retention mode operation of the latch circuit 132 may be allowed.

If the retention mode operation of the latch circuit 132 is allowed, the latch circuit 132 may operate in the transfer mode or the retention mode according to the safety signal SS. In an implementation, if the high-level safety signal SS is outputted from the second controller 120, the transistor Q4 may be turned off to allow the latch circuit 132 to operate in the transfer mode (see time t5). In addition, if the low-level safety signal SS is outputted from the second controller 120, the transistor Q4 may be turned on to allow the latch circuit 132 to operate in the retention mode (see time t9).

As described above, while the latch circuit 132 operates in the transfer mode, the switch control signal SCS corresponding to the control signal CS may be output to the driver 210. In an implementation, if the high level control signal CS is outputted from the first controller 110, the high-level switch control signal SCS may be outputted to the driver 210 (see times t6 and t8), and if the low-level control signal CS is outputted from the first controller 110, the low-level switch control signal SCS may be outputted to the driver 210 (see time t7).

On the other hand, while the latch circuit 132 operates in the retention mode, the switch control signal SCS may retain a previous state, i.e., a state at a time when the latch circuit 132 operates in the retention mode (see a period t9 to t10). An operating time of the latch circuit 132 in the retention mode may be controlled by the timer circuit 133. If the latch circuit 132 starts to operate in the retention mode (see time t9), the transistor Q5 of the timer circuit 133 may be turned off to allow the timer function of the timer circuit 133 to be turned on. If the timer function is turned on, the capacitor C3 of the timer circuit 133 may be gradually charged, and if a predetermined time elapses, the transistor M1 may be turned on by a voltage charged in the capacitor C3. If the transistor M1 is turned on, the transistor Q4 of the latch circuit 132 may be turned off to allow the retention function of the latch circuit 132 to be deactivated and the timer function of the timer circuit 133 to also be turned off (time t10).

Figure 4:
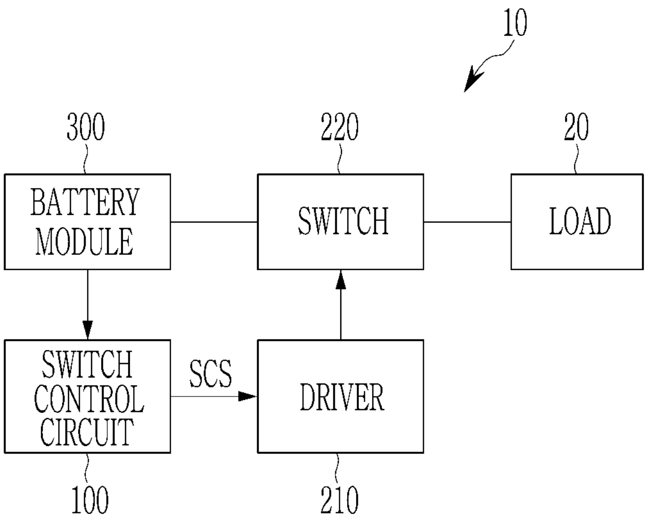
FIG. 4 is a block diagram showing a battery pack including a switch control device according to an example embodiment.

FIG. 4 shows a battery pack including a switch control device according to an example embodiment. Referring to FIG. 4, the battery pack 10 may include a battery module 300, a switch 220, a driver 210, and a switch control device 100.

The battery module 300 may include one or more cells that are connected in series or in parallel with each other. The switch 220 may control electrical connection between the battery module 300 and a load 20, and the switch driver 210 may drive the switch 220 according to the switch control signal SCS. The switch 220 may include a contactor or a relay.

The switch control device 100 may output the switch control signal SCS to the driver 210 to control an open or closed state of the switch 220. As described with reference to FIGS. 1 and 2, the switch control device 100 may include a first controller 110, a second controller 120, a retention circuit 130, and a retention control circuit 140.

The first controller 110 of the switch control device 100 may be a battery management system (BMS) of the battery pack 10. In this case, the first controller 110 may output the control signal CS, the disable signal DS, or the reset signal RS, based on state information of the battery module 300, state information of the system (e.g., a vehicle) in which the battery pack 10 is mounted, or a driving mode. In an implementation, the first controller 110 may determine whether to open or close the switch 220 according to the state of the battery pack 10 or a system in which the battery pack 10 is mounted and may output the control signal CS for controlling the switch 220. In addition, e.g., the first controller 110 may output the disable signal DS to limit the retention mode operation of the retention circuit 130 if the battery pack 10 or the system in which the battery pack 10 is mounted is in an abnormal state (e.g., when the power is initially turned on) that may cause the retention circuit 130 to malfunction. Then, if the battery pack 10 or the system in which the battery pack 10 is mounted stabilizes to enter the normal mode, the first controller 110 may output the reset signal RS to allow retention mode operation of the retention circuit 130.

The second controller 120 of the switch control device 100 may be a system basis chip (SBC). The SBC may include an integrated circuit (IC) in which a voltage regulator, a supervisory function, a reset generator, a watchdog function, a communication bus interface, and a wake-up logic are integrated.

As described above, in the switch control device 100 according to an embodiment, the final switch control signal SCS is configured to be outputted according to a logical product (AND) result of the control signal CS and the safety signal SS instead of the control signal CS and the safety signal SS operating in parallel. In an implementation, the switch control device 100 operates to output the high-level switch control signal SCS (indicating that switch 220 is on) only if the high-level control signal CS (instruction to turn on the switch 220) and the high-level safety signal SS (if the first controller 110 is operating normally) are inputted. Accordingly, the switch control signal SCS may be fixed to be used as it is without a need to switch signals for switch control at a time when the safety signal SS changes to an off (low level) state, and thus chattering due to delay errors between parts may be prevented during operation of the retention circuit. In addition, it is possible to prevent malfunction of the switch control device 100 in a noisy environment of a vehicle by ensuring that the switch control signal SCS is finally outputted in an on (high level) state only if both the control signal CS and the safety signal SS are on (high level).

In addition, the switch control device 100 may check a state of a vehicle equipped with the switch control device 100 to determine whether it is necessary to limit the retention mode operation of the retention circuit 130, may limit the retention circuit 130 from operating in a retention mode using the disable signal DS if the limit is needed, and may prevent malfunction of the switch control device 100 due to a vehicle condition by allowing the retention mode operation of the retention circuit 130 using the reset signal RS if the limit is not required. In addition, even if a problem occurs in the first controller 110, the limited or allowed state of the retention mode operation may be retained by controlling limiting or allowing of the retention mode operation of the retention circuit 130 using one pulse signal.

While embodiments of the present disclosure have been particularly shown and described with reference to the accompanying drawings, the specific terms used herein are only for the purpose of describing the disclosure and are not intended to define the meanings thereof or be limiting of the scope of the disclosure set forth in the claims. Therefore, a person of ordinary skill in the art will understand that various modifications and other equivalent embodiments of the present disclosure are possible. Consequently, the true technical protective scope of the present disclosure must be determined based on the technical spirit of the appended claims.

By way of summation and review, a high voltage battery pack for storing electrical energy obtained from various energy sources is applied to the environmentally-friendly vehicles is disclosed. A high voltage electric system of a vehicle uses high voltage electrical energy supplied from a high voltage battery for driving or electrical needs of the vehicle.

If output of the battery pack is suddenly cut off due to a hardware or software problem while a vehicle is using electrical energy of the battery pack, there is a risk of a driving force of the vehicle being lost, and thus the driver may lose control of the vehicle, leading to a safety issue.

According to the present disclosure, it is possible to improve safety by preventing an output of the battery pack from being suddenly cut off due to a temporary fault of the battery pack during operation in an environmentally friendly vehicle. The present disclosure has been made in an effort to provide a switch control device, and a battery pack including the same, which is capable of preventing an output of the battery pack from being suddenly cut off due to a temporary fault of the battery pack during operation in an environmentally friendly vehicle.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made.

What is claimed is:

1. A switch control device, comprising:

a retention circuit configured to receive a control signal and a safety signal, and to operate in one of a transfer mode and a retention mode according to the safety signal;

a retention control circuit configured to control the retention circuit to operate only in the transfer mode regardless of the safety signal if a disable signal is received;

a first controller configured to output the control signal to control a switch and to output the disable signal according to an operation state of a device in which the switch control device is mounted; and a second controller configured to output the safety signal according to the operation state of the first controller, wherein the retention circuit is further configured to output a switch control signal having a level varying according to the control signal in the transfer mode, and to retain the switch control signal in a previous state for a predetermined time in the retention mode, wherein the retention control circuit allows the retention circuit to operate in the retention mode if a reset signal is received, and the first controller outputs the reset signal according to the operation state of the device, and wherein the retention circuit includes:

a latch circuit operating in one of the transfer mode and the retention mode and outputting the switch control signal according to a logical product result of the control signal and the safety signal while operating in the transfer mode and retaining the switch control signal in a previous state while operating in the retention mode, and a timer circuit operating the latch circuit in the transfer mode if a predetermined time elapses after the latch circuit operates in the retention mode.

2. The switch control device as claimed in claim 1, wherein the retention circuit further includes an input circuit controlling switching of the latch circuit to the retention mode and starting a timer of the timer circuit according to the safety signal.

3. The switch control device as claimed in claim 2, wherein the input circuit includes:

a first transistor turned on or off according to the control signal and electrically connecting a first node and a second node if turned on; and a second transistor turned on or off according to the safety signal and electrically connecting the second node and a ground if turned on, wherein the latch circuit controls switching to the retention mode according to a voltage of the second node, and outputs the switch control signal according to a voltage of the first node in the transfer mode.

4. The switch control device as claimed in claim 3, wherein the first and second transistors are NPN transistors.

5. The switch control device as claimed in claim 3, wherein the latch circuit includes:

a third transistor turned on or off according to the voltage of the first node and electrically connecting an output node from which the switch control signal is output and a power node if turned on;

a fourth transistor turned on or off according to a voltage of a third node and electrically connecting the first node and the ground if turned on;

a first capacitor electrically connected between the power node and the first node;

a first resistor electrically connected between the power node and the first node;

a second resistor electrically connected between the third node and the output node; and a second capacitor electrically connected between the output node and the ground, wherein the voltage of the third node is determined by the voltage of the second node, a voltage of the output node, and a voltage applied from the timer circuit.

6. The switch control device as claimed in claim 5, wherein the third transistor is a PNP transistor, and the fourth transistor is an NPN transistor.

7. The switch control device as claimed in claim 5, wherein the latch circuit further includes:

a Zener diode including a cathode electrically connected to the second node and an anode electrically connected to the third node; and a fifth transistor turned on or off according to the voltage of the third node, and electrically connecting a control terminal of the second transistor and the ground if turned on, wherein the fifth transistor is an NPN transistor.

8. The switch control device as claimed in claim 7, wherein the timer circuit includes:

a sixth transistor turned on or off according to a voltage applied to a control terminal of the second transistor and electrically connecting a fourth node and the ground if turned on;

a third resistor connected between the power node and the fourth node;

a third capacitor connected between the fourth node and the ground; and a seventh transistor turned on or off according to a voltage of the fourth node and electrically connecting the third node and the ground if turned on.

9. The switch control device as claimed in claim 8, wherein the sixth transistor is an NPN transistor, and the seventh transistor is a metal oxide semiconductor field effect transistor.

10. The switch control device as claimed in claim 8, wherein the retention control circuit includes an off circuit outputting a timer off signal to the timer circuit to retain a timer operation of the timer circuit in an off state if the disable signal is input.

11. The switch control device as claimed in claim 10, wherein the off circuit includes:

an eighth transistor turned on or off according to a voltage of a fifth node and electrically connecting the power node and a sixth node if turned on;

a ninth transistor that is turned on or off according to a voltage of the sixth node and electrically connecting the fifth node and the ground if turned on;

a fourth capacitor electrically connected between the sixth node and the ground;

a fourth resistor electrically connected between the power node and a control terminal of the eighth transistor;

a fifth resistor electrically connected between the sixth node and a control terminal of the ninth transistor; and a diode including a first anode to which the disable signal is input, and a first cathode connected to the sixth node, wherein the timer off signal is output to the sixth node if the eighth transistor and the ninth transistor are turned on.

12. The switch control device as claimed in claim 11, wherein the eighth transistor is a PNP transistor, and the ninth transistor is an NPN transistor.

13. The switch control device as claimed in claim 11, wherein the timer circuit further includes:

a second diode including a second anode electrically connected to the fourth node and a second cathode electrically connected to a control terminal of the seventh transistor; and a third diode including an anode electrically connected to the sixth node and a cathode electrically connected to the control terminal of the seventh transistor.

14. The switch control device as claimed in claim 11, wherein the retention control circuit further includes:

a release circuit releasing an output of the timer off signal of the off circuit if the reset signal is input.

15. The switch control device as claimed in claim 14, wherein the release circuit includes a tenth transistor turned on or off according to the reset signal and electrically connecting the second node and the ground if turned on, and wherein the tenth transistor is an NPN transistor.

16. A battery pack, comprising:

a battery module including a plurality of cells connected in series or parallel to each other;

a switch controlling an electrical connection between the battery module and a load;

a driver controlling opening and closing of the switch; and the switch control device as claimed in claim 1, wherein the driver controls opening and closing of the switch according to a switch control signal output from the switch control device.

* * * * *